US009208938B2

(12) United States Patent
Ding et al.

(10) Patent No.: US 9,208,938 B2
(45) Date of Patent: Dec. 8, 2015

(54) INDUCTOR STRUCTURE HAVING EMBEDDED AIRGAP

(71) Applicant: International Business Machines Corporation, Armonk, NY (US)

(72) Inventors: Hanyi Ding, Colchester, VT (US); Anthony K. Stamper, Williston, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 10 days.

(21) Appl. No.: 14/044,269

(22) Filed: Oct. 2, 2013

(65) Prior Publication Data

US 2015/0091686 A1 Apr. 2, 2015

(51) Int. Cl.

*H01F 5/00* (2006.01)
*H01F 27/30* (2006.01)
*H01L 27/08* (2006.01)
*H01L 21/76* (2006.01)
*H01F 27/28* (2006.01)
*H01F 17/00* (2006.01)

(52) U.S. Cl.

CPC ........ *H01F 27/2804* (2013.01); *H01F 17/0013* (2013.01); *H01F 2017/004* (2013.01); *H01F 2027/2819* (2013.01)

(58) Field of Classification Search

CPC ..... H01L 21/764; H01L 28/10; H01L 21/762; H01L 21/7862; H01L 23/5222; H01F 17/0006; H01F 41/041; H01F 3/14; H01F 17/0013; H01F 2017/0086

USPC .......... 336/199, 200, 205, 208; 257/531, 528, 257/E21.581, 301, 532, 758, 534; 438/381, 438/329, 421, 238, 359, 422

See application file for complete search history.

(56) References Cited

U.S. PATENT DOCUMENTS 6,005,285 A * 12/1999 Gardner ............ H01L 21/02381 257/607
6,180,995 B1 * 1/2001 Hebert .......................... 257/531
6,426,267 B2 7/2002 Liou
6,437,418 B1 8/2002 Ferrari et al.
6,590,473 B1 7/2003 Seo et al.
6,677,659 B2 1/2004 Yen et al.
6,835,631 B1 12/2004 Zhen et al.
6,893,928 B2 * 5/2005 Sato ...................... H01L 21/324 257/E21.324
6,924,725 B2 * 8/2005 Bueyuektas et al. .......... 336/223
7,053,747 B2 5/2006 Joodaki et al.
7,255,801 B2 * 8/2007 Chen ............................... 216/13
7,311,242 B2 * 12/2007 Six .......................... H01L 23/20 228/180.22

(Continued)

*Primary Examiner* — Alexander Talpalatski
*Assistant Examiner* — Joselito Baisa
(74) *Attorney, Agent, or Firm* — David Cain; Hoffman Warnick LLC

(57) ABSTRACT

Various embodiments include inductor structures including at least one air gap for reducing capacitance between windings in the inductor structure. One embodiment includes an inductor structure having: a substrate; an insulation layer overlying the substrate; a conductive winding overlying the substrate within the insulation layer, the conductive winding wrapped around itself to form a plurality of turns substantially concentric about a central axis; an insulating structural support containing an air gap between the conductive winding and the insulation layer, the insulating structural support at least one of under, over or surrounding the plurality of turns of the conductive winding or between adjacent turns in the conductive winding; and at least one insulation pocket located radially inside a radially innermost turn in the plurality of turns with respect to the central axis.

12 Claims, 6 Drawing Sheets

(56) References Cited

U.S. PATENT DOCUMENTS

| | | | | |
|---|---|---|---|---|
| 7,629,201 | B2 * | 12/2009 | Gan | B81C 1/00269 257/E21.501 |
| 7,642,619 | B2 | 1/2010 | Matz et al. | |
| 7,662,722 | B2 | 2/2010 | Stamper et al. | |
| 8,018,003 | B2 * | 9/2011 | Patil | H01L 29/0653 257/368 |
| 8,044,757 | B2 | 10/2011 | Bae et al. | |
| 8,508,034 | B2 * | 8/2013 | Bolken | H01L 21/4803 257/692 |
| 8,994,127 | B2 * | 3/2015 | Kautzsch | B81C 1/00158 257/417 |
| 2005/0093668 | A1 | 5/2005 | Bueyuektas et al. | |
| 2012/0146229 | A1 * | 6/2012 | Cho | H01L 25/16 257/773 |
| 2013/0127675 | A1 * | 5/2013 | Mallat | G01R 21/02 343/703 |
| 2013/0200335 | A1 * | 8/2013 | Cho | H01L 27/15 257/13 |

* cited by examiner

INDUCTOR STRUCTURE HAVING EMBEDDED AIRGAP

FIELD

The subject matter disclosed herein relates to integrated circuits. More particularly, the subject matter relates to inductor structure and methods of forming such structures.

BACKGROUND

Conventional inductor structures include conductive wires, each formed in a series of windings that is wrapped around itself. The wire is formed over a substrate within an insulation material (e.g. silicon dioxide (SiO2)) layer to insulate the wire from its adjacent winding. Inductor structures may include multi-level (multi-line) structures connected by one or more vias (inter-level connectors). Conventional inductor structures experience winding capacitance effects which can affect the quality factor (Q) of the structure.

BRIEF DESCRIPTION

Various embodiments include inductor structures including at least one air gap for reducing capacitance between windings in the inductor structure. An air gap is formed when a sacrificial material, such is silicon, is embedded on a wafer and is subsequently removed and optionally hermetically sealed, leaving a cavity. Some particular embodiments include an inductor structure having: a substrate; an insulation layer overlying the substrate; a conductive winding overlying the substrate within the insulation layer, the conductive winding wrapped around itself to form a plurality of turns substantially concentric about a central axis; an insulating structural support containing an air gap between the conductive winding and the insulation layer, the insulating structural support at least one of under, over or surrounding the plurality of turns of the conductive winding or between adjacent turns in the conductive winding; and at least one insulation pocket located radially inside a radially innermost turn in the plurality of turns with respect to the central axis.

A first aspect includes an inductor structure having: a substrate; an insulation layer overlying the substrate; a conductive winding overlying the substrate within the insulation layer, the conductive winding wrapped around itself to form a plurality of turns substantially concentric about a central axis; an insulating structural support containing an air gap between the conductive winding and the insulation layer, the insulating structural support at least one of under, over or surrounding the plurality of turns of the conductive winding or between adjacent turns in the conductive winding; and at least one insulation pocket located radially inside a radially innermost turn in the plurality of turns with respect to the central axis.

A second aspect includes an inductor structure having: a substrate; an insulation layer overlying the substrate; a first conductive winding overlying the substrate within the insulation layer, the first conductive winding wrapped around itself to form a first plurality of turns substantially concentric about a central axis; a second conductive winding overlying the first conductive winding within the insulation layer, the second conductive winding wrapped around itself to form a second plurality of turns substantially concentric about the central axis; an insulating structural support containing an air gap between the second conductive winding and at least one of the insulation layer or the first conductive winding, the insulating structural support at least one of under, over or surrounding the plurality of turns of the second conductive winding or between adjacent turns in the second conductive winding; and at least one insulation pocket located radially inside a radially innermost turn in the plurality of turns of the second conductive winding with respect to the central axis.

A third aspect includes an inductor structure having: a substrate; an insulation layer overlying the substrate; a conductive winding overlying the substrate within the insulation layer, the conductive winding wrapped around itself to form a plurality of turns substantially concentric about a central axis; an insulating structural support containing an air gap between the conductive winding and the insulation layer, the insulating structural support at least one of under, over or surrounding the plurality of turns of the conductive winding or between adjacent turns in the conductive winding; and a plurality of insulation pockets located radially inside a radially innermost turn in the plurality of turns with respect to the central axis, wherein the conductive winding has a line width of approximately one micrometer to one hundred micrometers, and wherein each of the plurality of insulation pockets extends from a bottom of the conductive winding beyond a top of the conductive winding by approximately 2 micrometers to approximately 6 micrometers measured in a direction parallel with the central axis.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
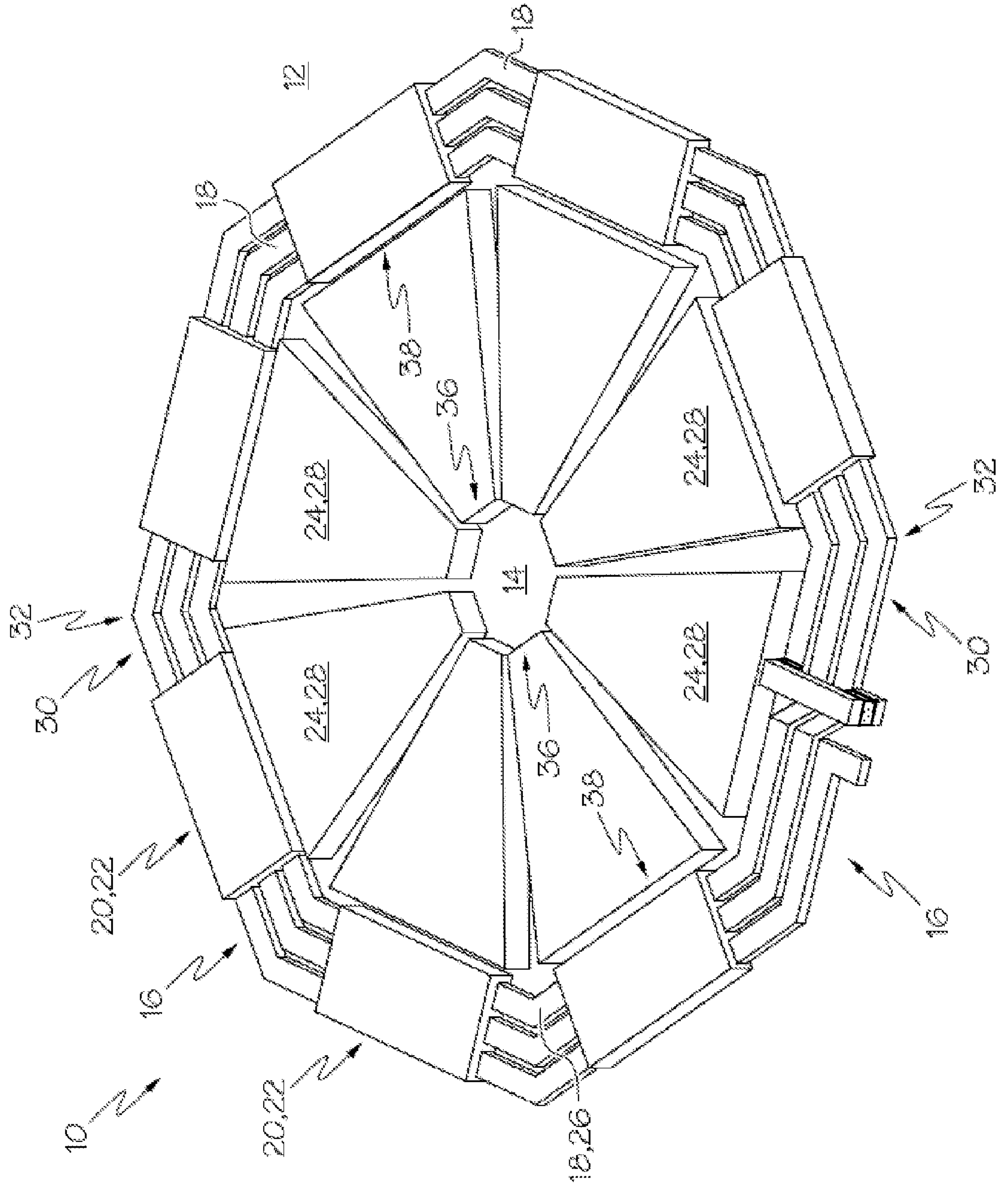
FIG. 1 shows a schematic perspective view of an inductor structure according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuits. More particularly, the subject matter relates to inductor structures including capacitance-modifying air gaps.

As described herein, conventional inductor structures experience winding capacitance effects which can affect the quality factor (Q) of the structure. In contrast to these conventional inductor structures, various embodiments include inductor structures including at least one insulating structural support containing an air gap (or, pocket) above, below, around and/or between winding(s) to reduce winding capacitance in the structure, thereby improving the quality factor (Q). These inductor structures can also experience improved useful bandwidth when compared with conventional inductor structures. In some particular cases, with a single level inductor quality factor can be improved by approximately 10 percent, with useful bandwidth improved by approximately 20 percent.

As described herein an air gap is formed in the inductor structures according to various embodiments, when a sacrificial material, such is silicon, is embedded on a wafer and is subsequently removed and optionally hermetically sealed, leaving a cavity. It is understood that, although the term air gap is used, in reality, there are residual gases from the sealing process in the cavity which can be at less than atmospheric pressure. If, according to various embodiments, the cavity is sealed off using plasma enhanced silicon dioxide using oxygen and silane as gas precursors at a pressure of 10 Torr, then there could be oxygen in the sealed cavity at a pressure of approximately 10 Torr.

Various particular embodiments include an inductor structure having: a substrate; an insulation layer overlying the substrate; a conductive winding overlying the substrate within the insulation layer, the conductive winding wrapped around itself to form a plurality of turns substantially concentric about a central axis; an insulating structural support containing an air gap between the conductive winding and the insulation layer, the insulating structural support at least one of under, over or surrounding the plurality of turns of the conductive winding or between adjacent turns in the conductive winding; and at least one insulation pocket located radially inside a radially innermost turn in the plurality of turns with respect to the central axis. It is understood that according to various embodiments, the insulation layer shown and described herein may not be necessary, as the substrate may include an insulating layer and/or insulating properties.

Other particular embodiments include an inductor structure having: a substrate; an insulation layer overlying the substrate; a first conductive winding overlying the substrate within the insulation layer, the first conductive winding wrapped around itself to form a first plurality of turns substantially concentric about a central axis; a second conductive winding overlying the first conductive winding within the insulation layer, the second conductive winding wrapped around itself to form a second plurality of turns substantially concentric about the central axis; an insulating structural support containing an air gap between the second conductive winding and at least one of the insulation layer or the first conductive winding, the insulating structural support at least one of under, over or surrounding the plurality of turns of the second conductive winding or between adjacent turns in the second conductive winding; and at least one insulation pocket located radially inside a radially innermost turn in the plurality of turns of the second conductive winding with respect to the central axis.

Additional particular embodiments include an inductor structure having: a substrate; an insulation layer overlying the substrate; a conductive winding overlying the substrate within the insulation layer, the conductive winding wrapped around itself to form a plurality of turns substantially concentric about a central axis; an insulating structural support containing an air gap between the conductive winding and the insulation layer, the insulating structural support at least one of under, over or surrounding the plurality of turns of the conductive winding or between adjacent turns in the conductive winding; and a plurality of insulation pockets located radially inside a radially innermost turn in the plurality of turns with respect to the central axis, wherein the conductive winding has a line width of approximately one micrometer to approximately one hundred micrometers, and wherein each of the plurality of insulation pockets extends from a bottom of the conductive winding beyond a top of the conductive winding by approximately 2 micrometers to approximately 6 micrometers measured in a direction parallel with the central axis.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

FIG. 1 shows a schematic perspective view of an inductor structure 10 according to various embodiments. As shown, the inductor structure 10 can include a substrate 12, e.g., at least one of silicon (Si) or silicon dioxide ($SiO_2$). Overlying the substrate 12 is an insulation layer 14 (e.g., including $SiO_2$ glass), which insulates adjacent layers of a conductive winding 16 overlying the substrate 12 and located within the insulation layer 14. The conductive winding 16 can be formed of any conventional conductive winding material, e.g., tungsten (W), copper (Cu) and/or an aluminum-based compound (e.g., Al—Cu).

The conductive winding 16 is wrapped around itself to form a plurality of turns (windings) 18 that are substantially concentric about a central axis (z). The central axis (z) is used as a reference point herein to delineate various aspects, however, it is understood that other reference point(s) may be used to describe various components of the inductor structures described.

In contrast to conventional inductor structures, the inductor structure 10 of FIG. 1 includes an insulating structural support 20 containing an air gap (several shown) 22 between the conductive winding 16 and the insulation layer 14. The insulating structural support 20 (containing the air gap 22) can be located at least one of under, over or surrounding the turns 18 of the conductive winding 16, or can be located between adjacent turns 18 of the conductive winding 16. According to various embodiments, the air gap 22 can be formed as a contained pocket of air within an the insulating structural support 20, which can include an oxide liner, including an oxide such as one or more of silicon dioxide ($SiO_2$), P-doped $SiO_2$, B-doped $SiO_2$, F-doped $SiO_2$, SiCOH, SiN, SiC, SiCN, $Al_2O_3$, $Ta_2O_5$, or any other dielectrics that are conventionally used in semiconductor wafer processing. The insulating structural support 20 (liner) can be deposited using any conventional method, such as chemical vapor deposition (CVD), plasma-enhanced CVD (PECVD), atomic layer CVD (ALD), high density plasma CVD (HDPCVD), thermal CVD (TH-CVD), sub-atmospheric CVD (SACVD), and the like. The air gap 22 can help to reduce capacitance between turns 18 (e.g., adjacent turns 18) of the conductive winding when compared with $SiO_2$. As noted herein, the air gap 22 is contained within the insulating structural support 20 (e.g., an oxide liner), which resides within the insulation layer 14, such that the insulating structural support 20 and the insulation layer 14 provide an air-tight seal on the air gap 22.

Also shown, the inductor structure 10 can include at least one insulation pocket 24 (several shown) located radially inside a radially innermost turn 26 in the plurality of turns 18 with respect to the central axis (z). According to various embodiments, the insulation pocket(s) 24 can be formed of an oxide such as those oxides noted herein, and can contain an air gap 28. As noted herein, the air gap 28 is contained within the insulation pocket 24, such that the insulation pocket 24 provides an air-tight seal on the air gap 28. The insulation pocket 24 may be substantially hollow, such that the air gap 28 occupies most of the internal volume in the insulation pocket 24.

In various embodiments, the inductor structure 10 can include a plurality of insulation pockets 24 symmetrically dispersed about the central axis (z). As shown, in some cases, each of the plurality of turns 18 can include a set of substantially straight sections 30 between each of a set of bends 32. In various embodiments, e.g., as shown in FIG. 1, the air gap 22 can span approximately 45 percent to approximately 90 percent of a length (L) of at least one of the substantially straight sections 30.

Figure 2:
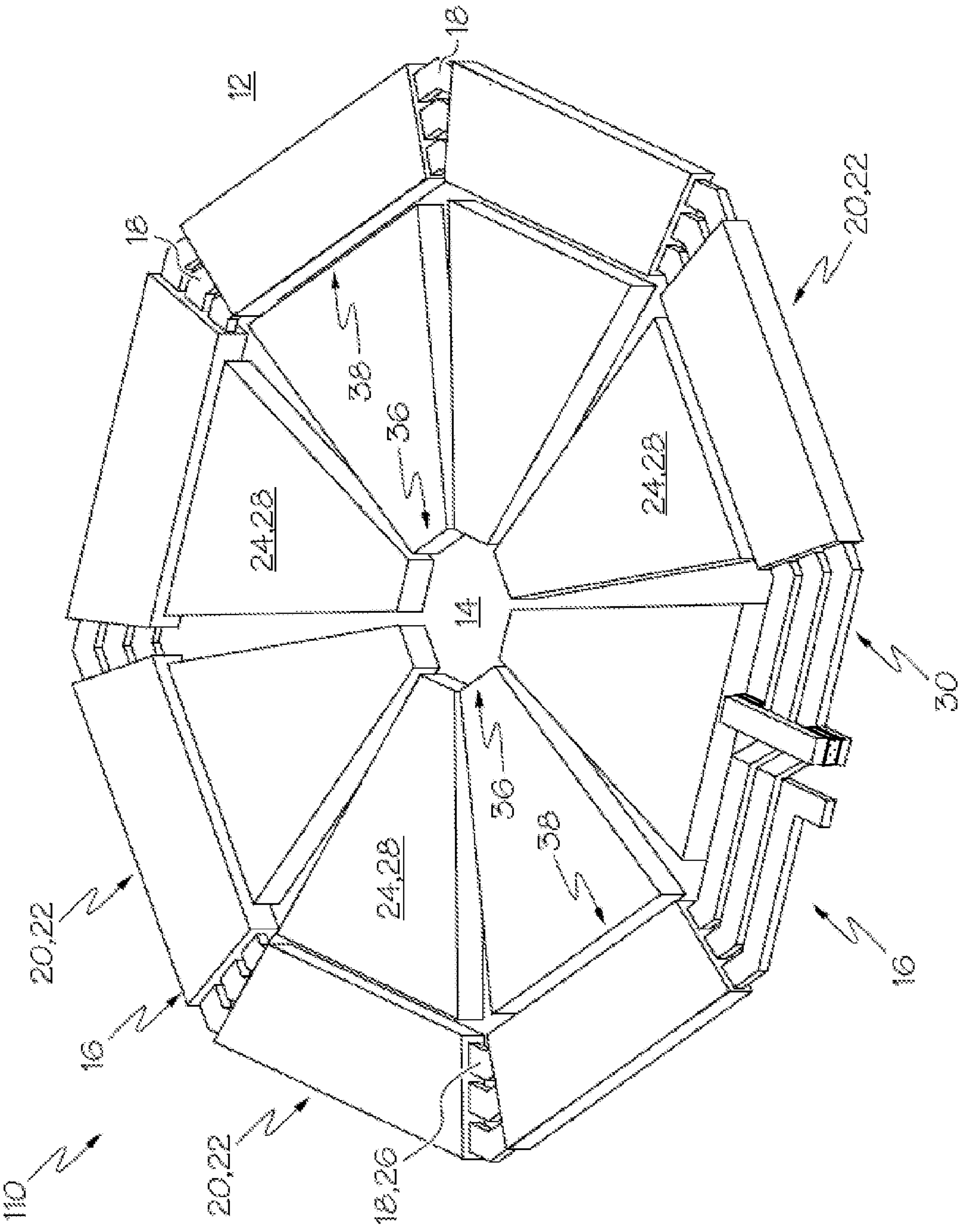
FIG. 2 shows a schematic perspective view of an inductor structure according to various additional embodiments.

In other embodiments, as shown in the schematic depiction of alternative inductor structure 110 in FIG. 2, the insulating structural support 20 (containing air gap 22) can span approximately 66 percent to approximately 90 percent of a length of the at least one of the substantially straight sections 30. With reference to both inductor structure 10 (FIG. 1) and alternative inductor structure 110 (FIG. 2), the insulation pocket(s) 24 can have a substantially trapezoidal shape (tapered radially inward) with a first base 36 having a first length and a second base 38 having a second length greater than the first length. The second length (second base 38) can span approximately 75 percent to approximately 85 percent of the length (L) of the substantially straight section 30.

According to various embodiments, the conductive winding 16 has a line width of approximately one micrometer to approximately one hundred micrometers. In these cases, each of the plurality of insulation pockets 24 extends from a bottom of the conductive winding 16 beyond a top of the conductive winding 16 by approximately 2 micrometers to approximately 6 micrometers measured in a direction parallel with the central axis (z).

Figure 3:
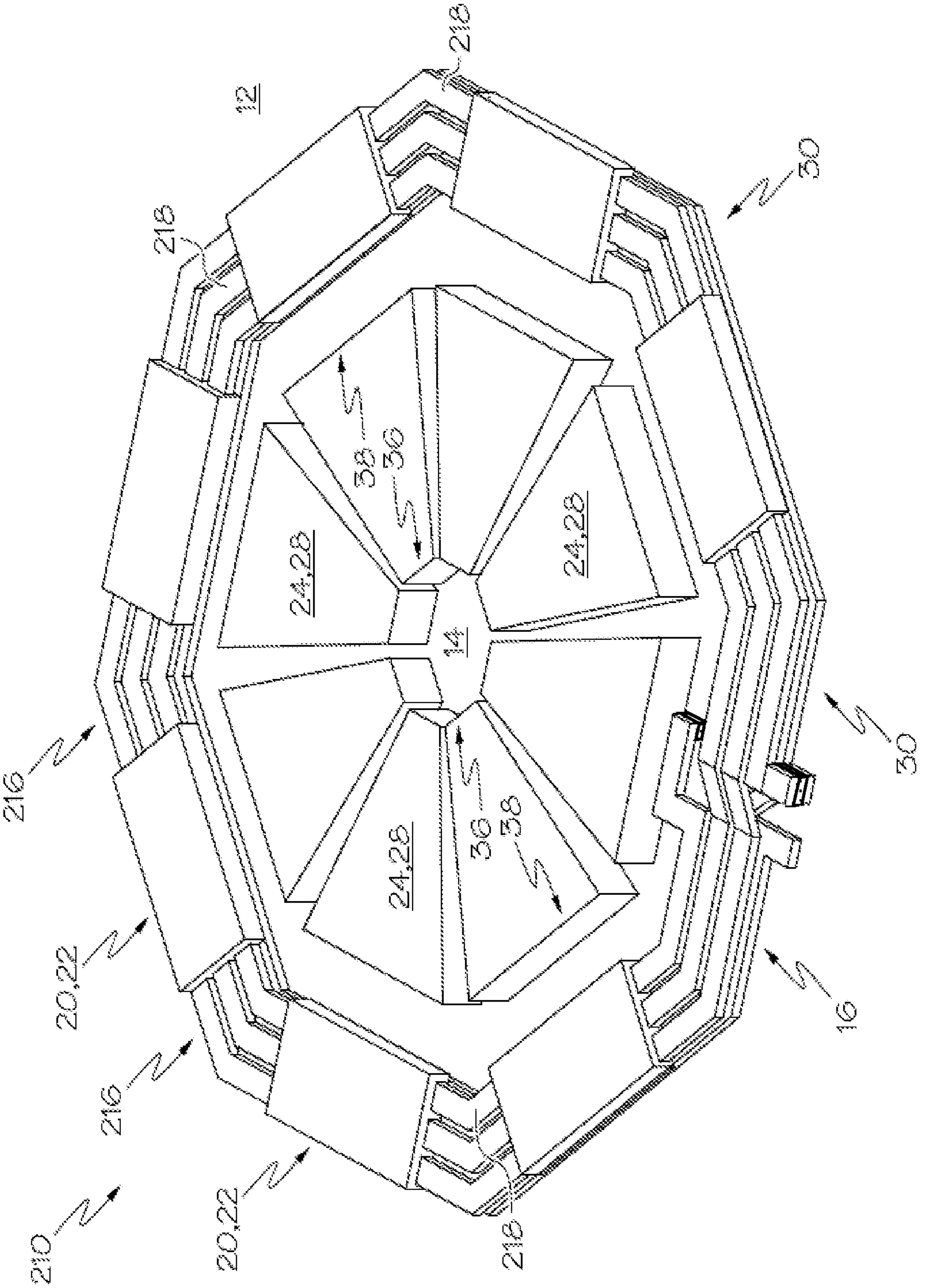
FIG. 3 shows a schematic perspective view of an inductor structure according to various additional embodiments.

FIG. 3 shows a three-dimensional perspective view of another inductor structure 210, including air gaps 22 and oxide pockets 24 as shown and described with reference to FIG. 1 and FIG. 2. The inductor structure 210 of FIG. 3 can include a multi-level inductor structure, including two distinct wiring (conductive winding) layers. As shown, the inductor structure 210 can include a substrate 12, an insulation layer 14 overlying the substrate, and a first conductive winding 16 overlying the substrate 12 and located within the insulation layer 14. As noted herein, the conductive winding 16 can be formed of any conventional conductive winding material, e.g., tungsten (W), copper (Cu) and/or an aluminum-based compound (e.g., Al—Cu).

The inductor structure 210 can also include a second conductive winding 216 overlying the first conductive winding 16 within the insulation layer 14. Similar to the first conductive winding 16, the second conductive winding 216 can be formed of any conventional conductive winding material, e.g., tungsten (W), copper (Cu) and/or an aluminum-based compound (e.g., Al—Cu). Further, as noted herein with respect to the first conductive winding 16, the second conductive winding 216 is wrapped around itself to form a second plurality of turns 218 substantially concentric about the central axis (z). As shown, the inductor structure 210 can also include an insulating structural support 20 containing an air gap 22 between the second conductive winding 216 and at least one of the insulation layer 14 or the first conductive winding 16. The insulating structural support 20 (containing air gap 22) is located at least one of under, over or surrounding the plurality of turns 218 of the second conductive winding 216, or, the insulating structural support 20 (containing air gap 22) is located between adjacent turns 218 in the second conductive winding 216.

Similarly to the inductor structure 10 shown and described with reference to FIG. 1, the inductor structure 210 can include at least one insulation pocket 24 (several shown) located radially inside a radially innermost turn 26 in the plurality of turns 18 with respect to the central axis (z). The insulation pocket 24 can include an air gap 28 as described herein.

According to various embodiments, the first conductive winding and the second conductive winding 216 each have a line width of approximately one micrometer to approximately one hundred micrometers. In these cases, each of the plurality of insulation pockets 24 extends from a bottom of the first conductive winding 16 beyond a top of the second conductive winding 216 by approximately 1 micrometer to approximately 2 micrometers measured in a direction parallel with the central axis (z).

Figure 4:
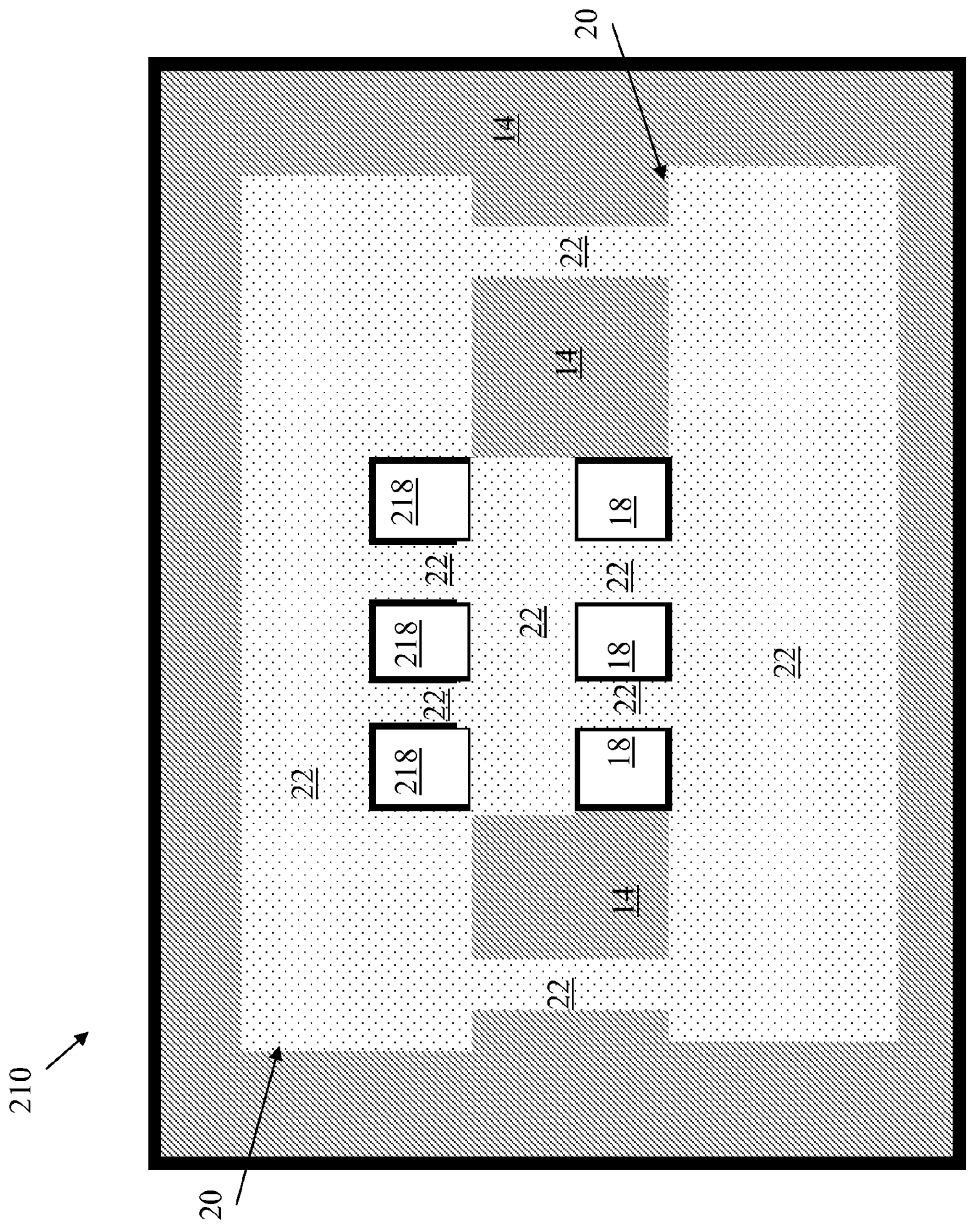
FIG. 4 shows a schematic cross-sectional depiction of one optional portion of the inductor structure of FIG. 3 according to various embodiments.

FIG. 4 shows a schematic cross-sectional depiction of one optional portion of the inductor structure 210, according to various embodiments. This cross-section is taken through one of the air gaps in a straight section 30 (FIG. 3) of the plurality of turns 18. In this embodiment, the insulating structural support 20 containing the air gap 22 substantially surrounds both the first conductive winding 16 and the second conductive winding 216. Additionally, the air gap 22 extends between adjacent turns 218 in the second conductive winding.

Several methods may be used to fabricate the structure shown in FIG. 4. One method can include encapsulating at least one of the turns 18 and the insulation material 14 in a sacrificial material, such as silicon. The sacrificial silicon, which will occupy the regions labeled as the air gap 22 before being removed, is formed using any known method including reverse damascene, and can be removed from vent holes using, e.g., $XeF_2$ gas. The gaps (vent holes) left after removal of the sacrificial silicon can then be optionally hermetically sealed using a sequential oxide and nitride deposition, as known in the art.

In various embodiments, a method of forming at least one cavity (e.g., air gap 22) can include: forming a first sacrificial cavity layer over a lower wiring layer; forming a layer; forming a second sacrificial layer over the first sacrificial layer and in contact with the layer; forming a lid on the second sacrificial cavity layer; forming at least one vent hole in the lid, exposing a portion of the second sacrificial cavity layer; venting or stripping the second sacrificial cavity layer such that a top surface of the second sacrificial cavity layer is no longer touching a bottom surface of the lid, before venting or stripping the first sacrificial cavity layer, thereby forming a first cavity and a second cavity, respectively.

Figure 5:
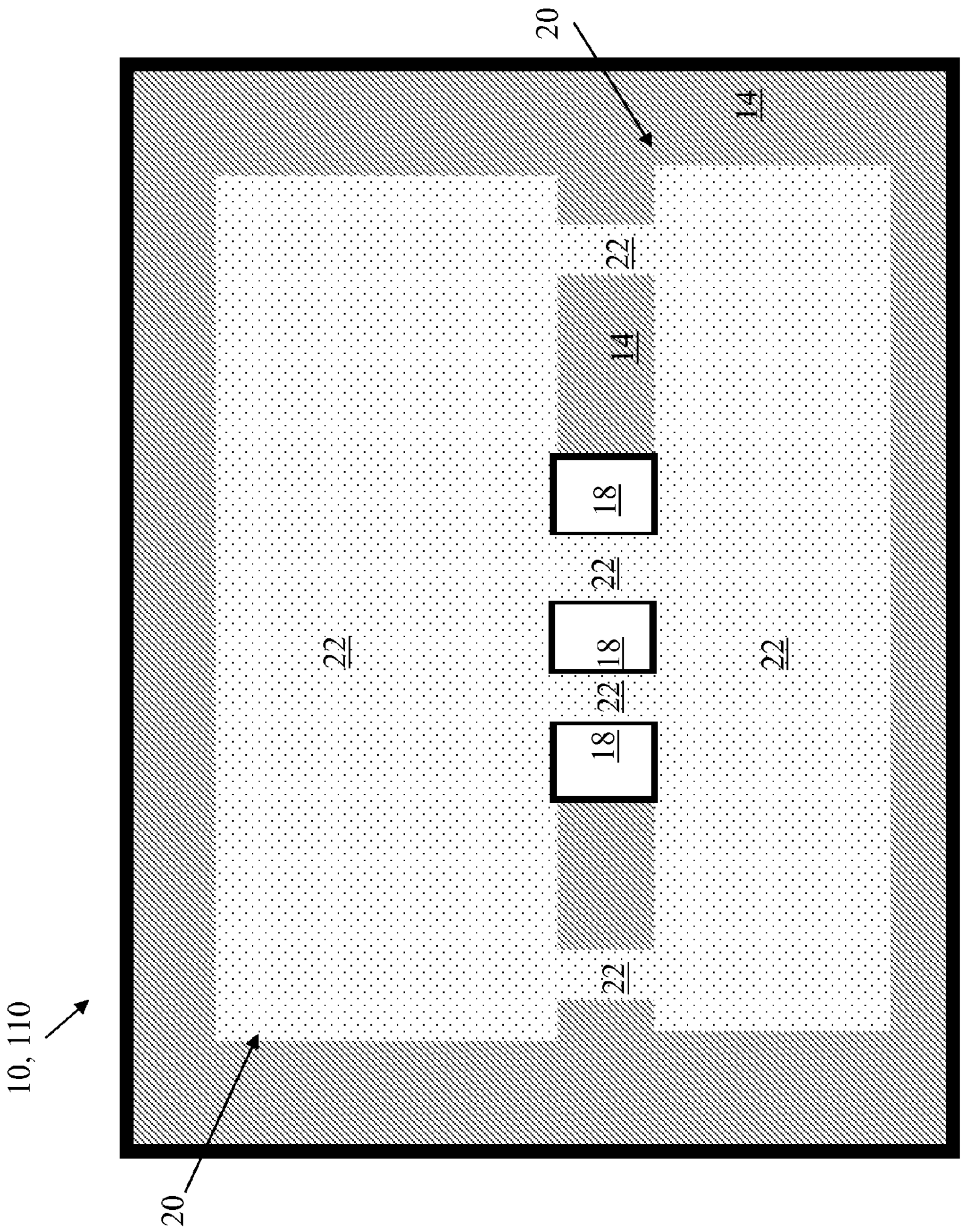
FIG. 5 shows a schematic cross-sectional depiction of a first optional portion of the inductor structures of FIG. 1 and/or FIG. 2 according to various embodiments.

FIG. 5 shows a schematic cross-sectional depiction of a first optional portion of the inductor structures 10 and/or 110 according to various embodiments. This cross-section is taken through one of the air gaps 22 in a straight section 30 (FIG. 1, FIG. 2) of the plurality of turns 18. In this embodiment, the air gap 22 substantially surrounds the first conductive winding.

Figure 6:
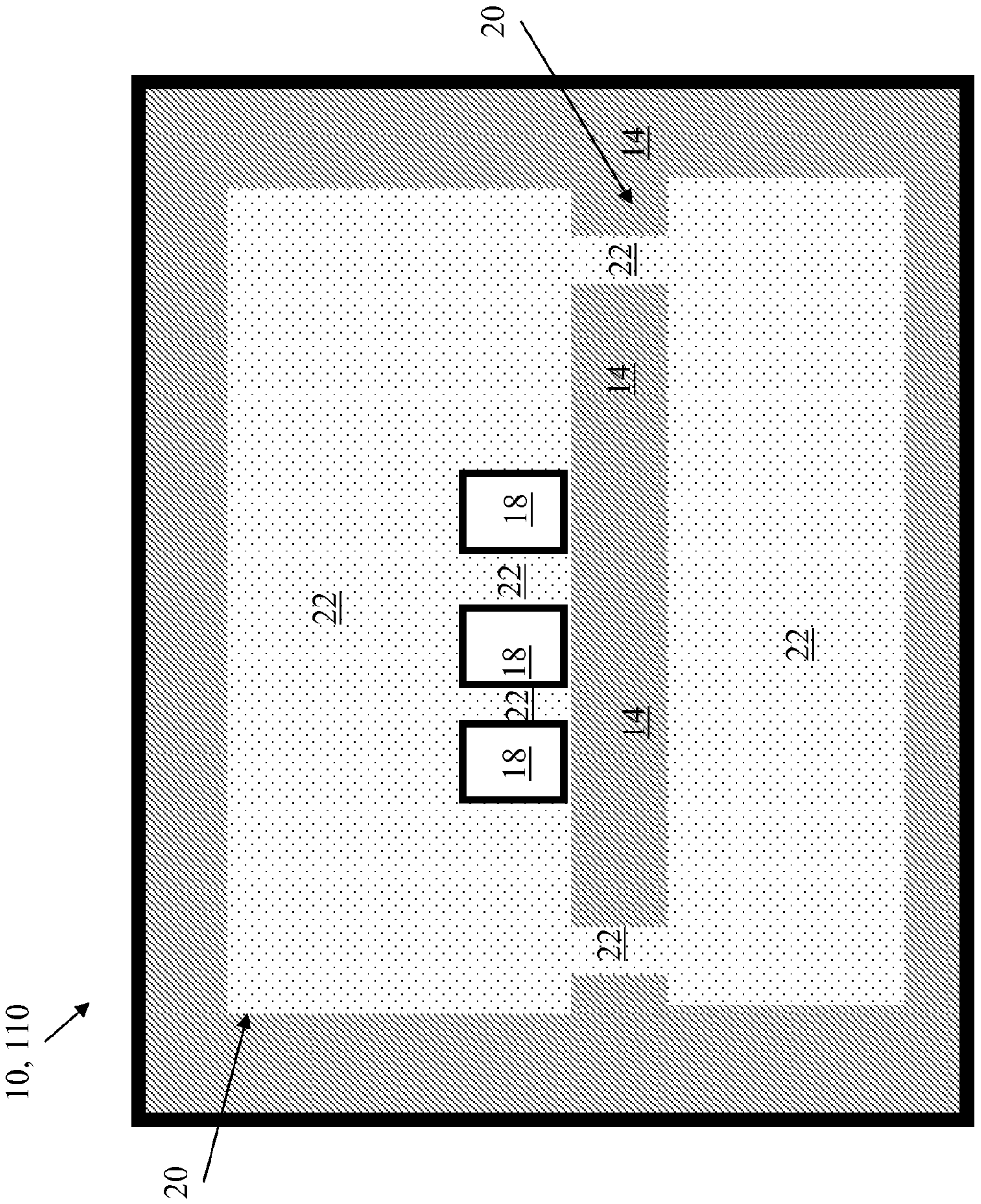
FIG. 6 shows a schematic cross-sectional depiction of a second optional portion of the inductor structures of FIG. 1 and/or FIG. 2 according to various embodiments.

FIG. 6 shows a schematic cross-sectional depiction of a second optional portion of the inductor structures 10 and/or 110 according to various embodiments. This cross-section is taken through one of the air gap 22 in a straight section 30 (FIG. 1, FIG. 2) of the plurality of turns 18. In this embodiment, the air gap 22 substantially surrounds the first conductive winding. Additionally, the air gap 22 extends between adjacent turns 18 in the conductive winding 16.

The terminology used herein is for the purpose of describing particular example embodiments only and is not intended to be limiting. As used herein, the singular forms “a”, “an” and “the” may be intended to include the plural forms as well, unless the context clearly indicates otherwise. The terms “comprises,” “comprising,” “including,” and “having,” are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being “on”, “engaged to”, “connected to” or “coupled to” another element or layer, it may be directly on, engaged, connected or coupled to the other element or layer, or intervening elements or layers may be present. In contrast, when an element is referred to as being “directly on,” “directly engaged to”, “directly connected to” or “directly coupled to” another element or layer, there may be no intervening elements or layers present. Other words used to describe the relationship between elements should be interpreted in a like fashion (e.g., “between” versus “directly between,” “adjacent” versus “directly adjacent,” etc.). As used herein, the term “and/or” includes any and all combinations of one or more of the associated listed items.

Spatially relative terms, such as “inner,” “outer,” “beneath”, “below”, “lower”, “above”, “upper” and the like, may be used herein for ease of description to describe one element or feature’s relationship to another element(s) or feature(s) as illustrated in the figures. Spatially relative terms may be intended to encompass different orientations of the device in use or operation in addition to the orientation depicted in the figures. For example, if the device in the figures is turned over, elements described as “below” or “beneath” other elements or features would then be oriented “above” the other elements or features. Thus, the example term “below” can encompass both an orientation of above and below. The device may be otherwise oriented (rotated 90 degrees or at other orientations) and the spatially relative descriptors used herein interpreted accordingly.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. An inductor structure comprising:

a substrate;

an insulation layer overlying the substrate;

a conductive winding overlying the substrate within the insulation layer, the conductive winding wrapped around itself to form a plurality of turns substantially concentric about a central axis, wherein the insulation layer and the conductive winding are located on a same level in the inductor structure;

an insulating support structure containing an air gap, the air gap surrounding the plurality of turns of the conductive winding and the insulation layer; and a plurality of insulation pockets located radially inside a radially innermost turn in the plurality of turns with respect to the central axis, wherein the plurality of insulation pockets are all located on the same level in the inductor structure as the insulation layer and the conductive winding.

2. The inductor structure of claim 1, wherein each of the at least one plurality of insulation pockets contains an additional air gap.

3. The inductor structure of claim 2, wherein each of the insulation pockets provides an air-tight seal on each additional air gap, and wherein each additional air gap is separated from the air gap by the insulation layer.

4. The inductor structure of claim 1, wherein the plurality of insulation pockets are symmetrically dispersed about the central axis and all located on the same level in the inductor structure as the insulation layer and the conductive winding.

5. The inductor structure of claim 1, wherein each of the plurality of turns includes a set of substantially straight sections between each of a set of bends.

6. The inductor structure of claim 5, wherein the insulating support structure containing the air gap spans approximately 45 percent to approximately 90 percent of a length of at least one of the substantially straight sections.

7. The inductor structure of claim 5, wherein the insulating support structure containing the air gap spans approximately 66 percent to approximately 90 percent of a length of the at least one of the substantially straight sections.

8. The inductor structure of claim 5, wherein each of the plurality of insulation pockets has a substantially trapezoidal shape with a first base having a first length and a second base having a second length greater than the first length, wherein the second length spans approximately 75 percent to approximately 85 percent of a length of the at least one of the substantially straight sections.

9. The inductor structure of claim 1, wherein the insulation layer includes silicon dioxide glass.

10. An inductor structure comprising:

a substrate;

an insulation layer overlying the substrate;

a conductive winding overlying the substrate within the insulation layer, the conductive winding wrapped around itself to form a plurality of turns substantially concentric about a central axis, wherein the insulation layer and the conductive winding are located on a same level in the inductor structure;

an insulating support structure containing an air gap the air gap surrounding the plurality of turns of the conductive winding and the insulation layer; and a plurality of insulation pockets located radially inside a radially innermost turn in the plurality of turns with respect to the central axis, wherein the plurality of insulation pockets are all located on the same level in the inductor structure as the insulation layer and the conductive winding, wherein the conductive winding has a line width of approximately one micrometer to one hundred micrometers, and wherein each of the plurality of insulation pockets extends from a bottom of the conductive winding beyond a top of the conductive winding by approximately 2 micrometers to approximately 6 micrometers measured in a direction parallel with the central axis.

11. The inductor structure of claim 10, wherein each of the plurality of insulation pockets contains an additional air gap.

12. The inductor structure of claim 10, wherein the plurality of insulation pockets are symmetrically dispersed about the central axis.

* * * * *